(12) United States Patent
Selvamanickam et al.

(10) Patent No.: US 8,682,406 B2
(45) Date of Patent: Mar. 25, 2014

(54) MULTIFILAMENT SUPERCONDUCTOR HAVING REDUCED AC LOSSES AND METHOD FOR FORMING THE SAME

(75) Inventors: Venkat Selvamanickam, Houston, TX (US); Senthil Sambandam, Stafford, TX (US)

(73) Assignees: University of Houston System, Houston, TX (US); Superpower, Inc., Schenectady, NY (US)

(*) Notice: Subject to any disclaimer, the term of this patent is extended or adjusted under 35 U.S.C. 154(b) by 0 days.

(21) Appl. No.: 13/166,325

(22) Filed: Jun. 22, 2011

(65) Prior Publication Data
US 2011/0319271 A1   Dec. 29, 2011

Related U.S. Application Data

(60) Provisional application No. 61/358,369, filed on Jun. 24, 2010.

(51) Int. Cl.
*H01L 39/14* (2006.01)
(52) U.S. Cl.
USPC .......................................... 505/231; 505/431
(58) Field of Classification Search
USPC ............................ 505/230, 231, 431; 427/62
See application file for complete search history.

(56) References Cited

U.S. PATENT DOCUMENTS

| | | | |
|---|---|---|---|
| 6,926,921 B2 | 8/2005 | Stasiak et al. | |
| 7,674,751 B2 | 3/2010 | Malozemoff et al. | |
| 2006/0040829 A1* | 2/2006 | Rupich et al. | 505/100 |
| 2007/0191202 A1* | 8/2007 | Foltyn et al. | 501/12 |
| 2009/0131262 A1* | 5/2009 | Zhang et al. | 505/237 |
| 2009/0137399 A1* | 5/2009 | Ueyama et al. | 505/230 |

FOREIGN PATENT DOCUMENTS

JP    2009218008 A    9/2009

OTHER PUBLICATIONS

PCT/US2011/041422 International Search Report and Written Opinion dated Feb. 9, 2012 (11 p.).

* cited by examiner

*Primary Examiner* — Colleen Dunn
(74) *Attorney, Agent, or Firm* — Conley Rose, P.C.

(57) ABSTRACT

A high temperature superconductor structure including: a substrate on which at least one buffer layer is deposited, a superconductor layer on the buffer layer, the superconducting layer composed of superconductor material that forms at least two substantially parallel superconductor filaments that continuously extend along the length of the substrate wherein at least two superconductor filaments are separated from each other by at least one insulating strip wherein the insulating strip continuously extends along the length of the substrate and is composed of insulating material with a resistivity greater than about 1 mΩcm. Also disclosed are methods of producing high temperature superconductors.

64 Claims, 16 Drawing Sheets

MULTIFILAMENT SUPERCONDUCTOR HAVING REDUCED AC LOSSES AND METHOD FOR FORMING THE SAME

CROSS-REFERENCE TO RELATED APPLICATIONS

This application claims the benefit under 35 U.S.C. §119 (e) of U.S. Provisional Patent Application No. 61/358,369 filed Jun. 24, 2010, the disclosure of which is incorporated herein by reference.

STATEMENT REGARDING FEDERALLY SPONSORED RESEARCH OR DEVELOPMENT

Not applicable.

BACKGROUND

1. Field of the Disclosure

The present disclosure relates generally to high temperature superconductors (HTS), and more specifically to a multifilament, AC tolerant superconductor and method of forming the same.

2. Background of the Disclosure

The potential for high temperature superconductors (HTS) to efficiently transmit, generate, transform, use, and store electrical energy is recognized. In particular, more efficient electric power systems depend on more efficient wire technology. Past advancements permit brittle HTS materials to be formed into kilometer-length wires capable of transmitting about two hundred times the current than conventional copper and aluminum conductors of the same physical dimensions. Recent research in HTS materials provides potential for the economically feasible use of such materials in the power industry, including applications for power generation, transmission, distribution, and storage. The use of HTS devices in the power industry would result in significant reduction in the size (i.e., footprint) of electric power equipment, reduced environmental impact, greater safety, and increased capacity over conventional technology.

Two generations of HTS wire materials have been explored previously. The first generation (hereinafter "1G") of HTS wires included the use of BSCCO high-$T_c$ superconductor, typically embedded in a matrix of noble metal (e.g. Ag). Without limitation, 1G wires are fabricated by a thermomechanical process wherein the superconducting powder is packed into silver billets that are drawn, rolled, and heat-treated to form the wire. The drawbacks of 1G wires are the high materials costs (e.g. Ag), elaborate processing operations, and generally poor critical current performance in high magnetic fields at high temperatures, which limit the lengths of the wires.

The second generation (hereinafter "2G") HTS wire processing involves thin film deposition of a multilayer stack on nickel alloy tapes. In order to achieve high critical currents, the maximal current of a superconductor, the superconducting film is grown epitaxially in a single-crystalline-like form on oxide buffer layers that provide a single crystalline-like template even when deposited on polycrystalline metal substrate. In certain instances, 2G HTS tape utilizes YBCO coated conductors.

Recently, the focus of the HTS industry has been to increase current carrying capacity, throughput of wire production, and decrease manufacturing cost. The objective is to fabricate commercially viable, high performance HTS wire that is available to the power industry to build devices, such as transmission cables and transformers, for the power grid. Recent prototypes have confirmed the great potential of HTS wire in electric power applications but have also shed light on deficiencies that pose risk to their widespread implementation.

Although superconductors have zero resistance to DC current, the architecture of the coated conductor has yet to be optimized for AC applications, such as motors, generators, and transformers. Hysteretic losses in the superconductor are the major component of AC losses and scale inversely as the width of the filament. In particular, the width to thickness ratio of HTS wire is high, which results in HTS coated conductors exhibiting very high hysteretic losses. The magnitude of the losses also varies with AC field amplitude and frequency and thus varies in different applications. AC losses in a typical 2G HTS wire with a copper stabilizer can be as high as 100 kW over 10 km in a perpendicular field of 100 mT at 60 Hz.

A significant reduction of hysteretic losses in HTS wires is a prerequisite for their use in AC power applications, such as transformers, generators, and motors. In practice, AC losses result in increased cryogenic burden and impose risks on electric power systems. To mitigate these risks, higher cooling capacities or redundant cooling equipment must be used, which greatly increases the overall system cost and is a significant deterrent to the adoption of this immature technology. For these reasons, the development of a commercially viable, high performance, AC tolerant HTS wire would be a transformational solution that would open up the application of superconducting products into electric power systems.

It known that hysteretic losses can be reduced if the superconducting layer is divided into many filament-like superconducting structures, segregated by non-superconducting resistive barriers. Therefore, to minimize AC hysteretic losses, it is desirable to subdivide the current-carrying HTS layer of a tape into long thin linear stripes, or filaments, thereby forming a multifilament conductor. Although these multifilament conductors have been shown to greatly reduce hysteretic losses, numerous engineering and manufacturing challenges remain prior to full commercialization of these HTS wires because the scale up of multifilamentary 2G HTS wire to industrial manufacturing is fraught with numerous barriers.

The method of fabricating low AC loss 2G HTS wire is to subdivide the superconducting and insulating material into multiple filaments by first depositing the superconducting layer and then etching the superconductor layer (by physical or chemical techniques) to create striations or continuous filaments. The use of an etchant inevitably results in damage to the superconducting material, such as edge rippling, undercutting, and broken filaments. The filament damage becomes more prominent when the gap between filaments is narrowed. More specifically, the filament damage greatly reduces the current carrying capacity of the HTS wire. Furthermore, if the etching process is modified to avoid filament damage, bridges or other incomplete separations between the filaments may be left behind which results in the coupling of filaments and negates the AC loss reduction. In fact any superconductor residue that remains in the gaps after etching can result in filamentary coupling. If the gap is widened to circumvent these problems, more superconducting material is removed which greatly reduces the current carrying capacity of the wire. Even at short lengths, such as meter lengths, these multi-filamentary 2G HTS wire contain the flaws described herein. As such, producing kilometer-long 2G HTS wires with fine filaments of continuous superconducting parallel lines, running end to end poses a technological barrier to scaling up the use of HTS wire in electric power systems.

As such, a commercially feasible method does not exist for fabricating an AC tolerant HTS wire by an etch-free process to produce a multi-filament HTS layers. Some etch-free techniques had been proposed, such as creating scratches on substrate prior to superconductor growth (U.S. Patent App. Pub. No. 2007/0191202, to Foltyn et al), or inkjet printing of superconducting filaments (R. C. Duckworth, M. P. Paranthaman, M. S. Bhuiyan, F. A. List, and M. J. Gouge, IEEE Trans. Appl. Supercond. 17, 3159 (2007)), or the dropwise deposition of superconducting material (U.S. Patent App. Pub. No. 2006/0040829, to Rupich et al). However, these techniques result in unintentional coupling of filaments that leads to poor and inconsistent AC loss reduction and tapes that cannot be utilized even in meter lengths, yet alone kilometer lengths. This highlights that in addition to providing a high degree of precision and control for producing a multi-filamentary HTS wire, any etch-free technique must be compatible with the current techniques of manufacturing HTS conductors, and it is also essential to control the flux and current distributions in the HTS tape.

BRIEF SUMMARY

According to a first aspect of the present disclosure, a high temperature superconductor structure is provided comprising a substrate on which at least one buffer layer is deposited, said substrate having a length and a width, wherein the length is at least about 100 m and the substrate has a dimension ratio of not less than about $10^3$; a superconductor layer on said at least one buffer layer, said layer comprised of superconductor material that forms at least two substantially parallel superconductor filaments that continuously extend along the length of said substrate; wherein the at least two superconductor filaments are separated from each other by at least one insulating strip having a first and second surface opposite each other, said first surface overlying said buffer layer and said second surface being substantially free of said superconductor material; wherein the at least one insulating strip continuously extends along the length of said substrate and is comprised of insulating material with a resistivity greater than about 1 mΩcm, According to another aspect of the disclosure, a method for producing a high temperature superconductor structure is provided, comprising the steps of providing a buffered substrate comprising a substrate and at least one buffer layer; depositing on the buffered substrate at least one insulating strip that continuously extends along the length of said buffered substrate and is comprised of insulating material with a resistivity greater than about 1 mΩcm, such that the at least one insulating strip has a first and second surface opposite each other and said first surface is adjacent to said buffered substrate; and depositing superconducting material on said the buffered substrate to form a superconducting layer comprised of at least two superconductor filaments that continuously extend along the length of said substrate, are separated from each other by the at least one insulating strip and are substantially parallel, wherein the second surface of said insulating strip is substantially free of said superconductor material.

BRIEF DESCRIPTION OF THE DRAWINGS

The present disclosure may be better understood by referencing the accompanying drawings.

Figure 1:
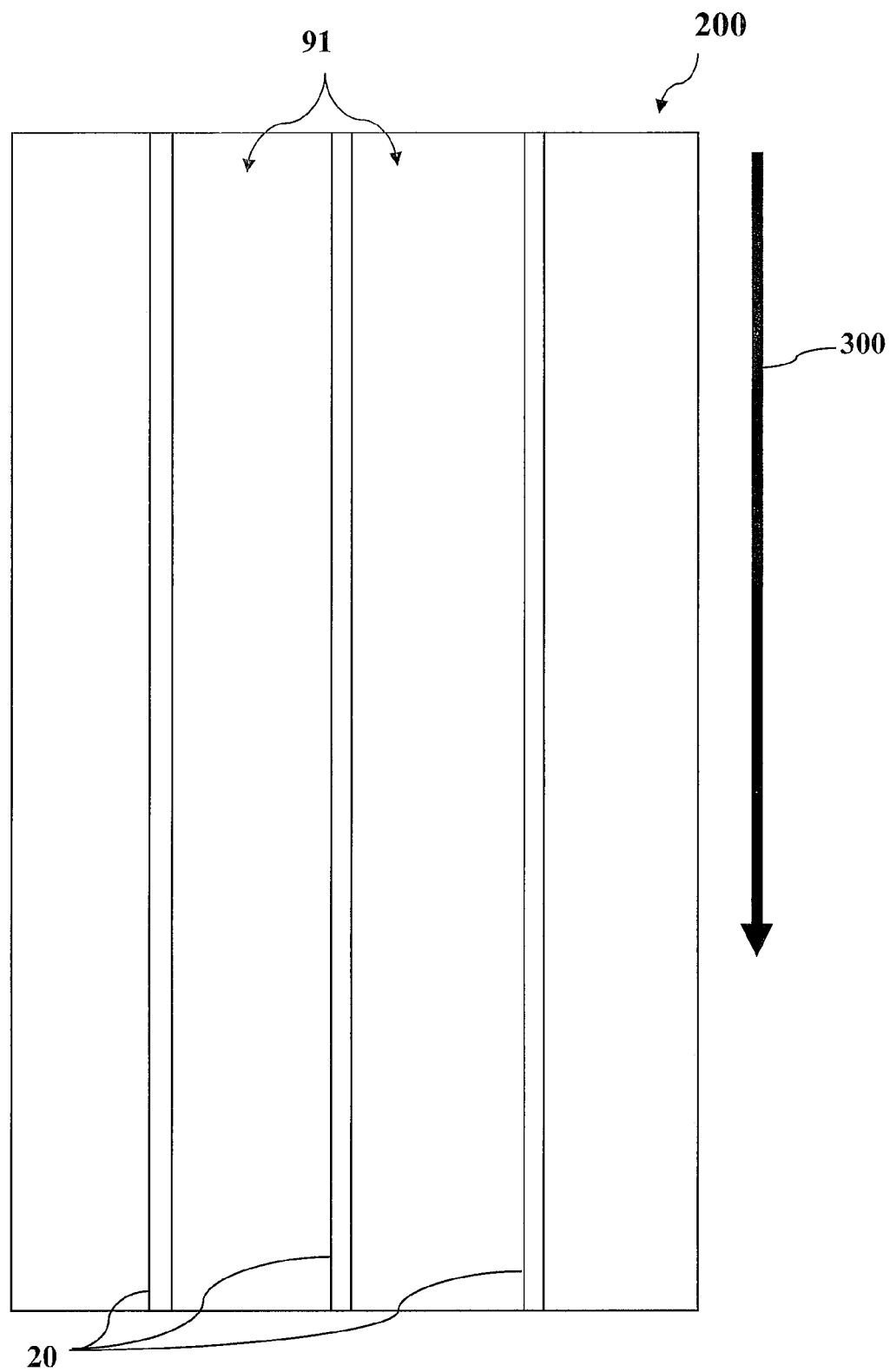
FIG. 1 illustrates an exemplary multifilament HTS structure in accordance with the disclosure.

The use of the same reference symbols in multiple parts of drawings, different drawings, or in different embodiments may indicate similar or identical items as described herein. Referring to the drawings in general, it should be understood that the illustrations are not drawn to scale, and are for the purpose of describing a particular embodiment of the present disclosure and are not intended to limit the scope of the disclosure thereto.

The use of the same reference symbols in multiple parts of drawings, different drawings, or in different embodiments may indicate similar or identical items as described herein. Referring to the drawings in general, it should be understood that the illustrations are not drawn to scale, and are for the purpose of describing a particular embodiment of the present disclosure and are not intended to limit the scope of the disclosure thereto.

DETAILED DESCRIPTION

Overview:

The present disclosure eliminates the filamentary etching process that has been ubiquitously used to fabricate multifilamentary 2G HTS wire. More specifically, this disclosure is directed to multifilament HTS coated conductors and the etch-free method of fabricating the same. In accordance with one embodiment of the disclosure, the etch-free fabrication of a multifilament AC tolerant superconductor comprises the deposition of the at least one insulating filament prior to deposition of the superconducting material. In accordance with another embodiment of the disclosure, the etch-free fabrication of a multi-filament AC tolerant superconductor comprises the deposition of the superconducting material prior to the deposition of at least one insulating filament and subsequent heat treatment.

Multifilament HTS:

FIG. 1 shows a multifilament HTS structure that is in accordance with an exemplary embodiment of the present disclosure. The embodiment shown in FIG. 1 shows a HTS conductor 200 comprising superconducting filaments 91 alternating with insulating strips 20. In the exemplary embodiment shown in FIG. 1, the superconducting filaments 91 and insulating strips 20 are shown running parallel to the direction of current flow 300 along the "wire" or "tape." Without limitation by any particular theory, the exemplary HTS conductor 200 may be useful for increasing current carrying capability and reducing AC resistive losses in HTS "wires or tapes."

As used herein, the terms "wire" and "tape" are used interchangeably to mean a HTS conductor with attributes that make it useful for creating superconducting devices such as cables, transformers, generators, or power grids, or other means to carry electrical power from one location to another and distribute or otherwise deliver electrical power to a number of locations, or devices. For example, the width of the tape or wire may be generally on the order of about 0.01 cm to about 20 cm, alternatively, 0.1 cm to about 15 cm and in certain instances the width of the tape or wire may be between about 0.4 cm to about 10 cm and the length of the tape is typically at least about 100 m, more typically about 500 m, but may even have a length on the order of about 1 km or more. The term "tape" or "tape-like" refers to an article having a high dimension ratio for example, a length to width ratio, on the order of not less than about $10^2$, alternatively, a dimension ratio not less than about $10^3$. Alternatively, the dimension ratio is greater than about $10^4$ and further instances, the tape or wire article has a dimension ratio of about $10^5$ and higher. As used herein, the term "dimension ratio" is used to denote the ratio of the longest dimension of the article to the next longest dimension of the article, for example the ratio of length to width.

Additionally, the article may have a thickness, the width to thickness ratio may be on the order of not less than about 10 alternatively, not less than about $10^2$, further the ratio may be greater than about $10^3$ and certain instances, the tape or wire article has a width to thickness ratio of about $10^5$ and higher. Without limitation by theory, as used herein an article having a large dimension ratio (e.g. greater than $10^2$) and a large width to thickness ratio (e.g. greater than about 10) may be considered a "tape" or "tape-like."

Figure 2:
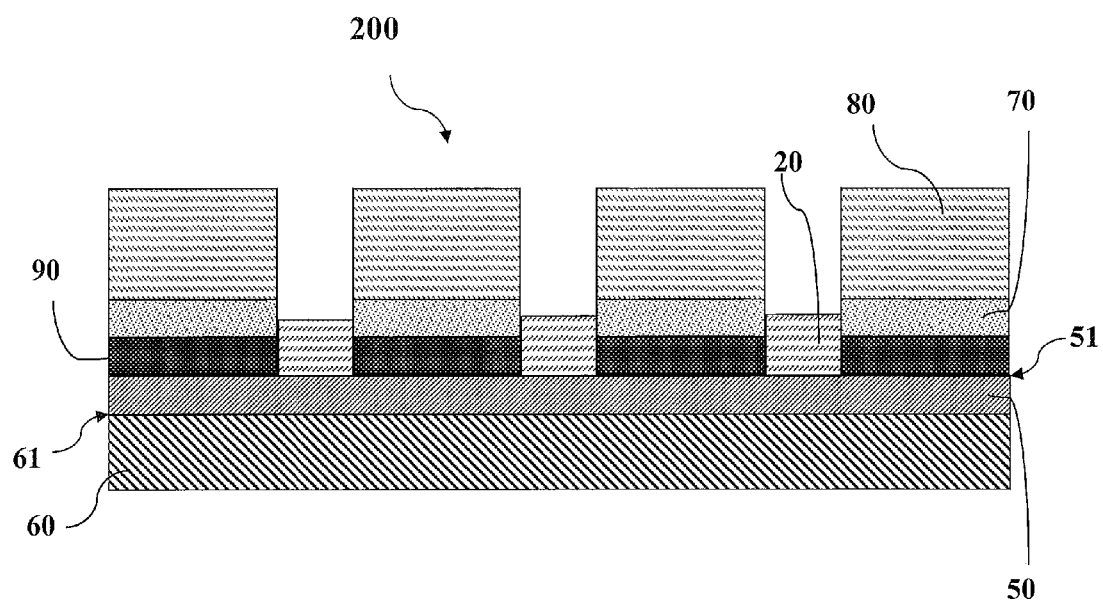
FIG. 2 illustrates a cross-section illustration of an exemplary embodiment of the present disclosure.

FIG. 2 is a cross-sectional view of an HTS conductor 200 according to an embodiment of the present disclosure having a multi-layer composition. Also shown in FIG. 2 are insulating strips 20 overlying surface 61 of the substrate 60, positioned between the superconducting layers 90. In accordance with the disclosure, HTS conductor 200 includes generally a substrate 60, at least one buffer layer 50 overlying surface 61 of the substrate 60, a superconducting layer 90 overlying surface 51 of the at least one buffer layer 50. The superconductor layer 90 has a first stabilizer layer or capping layer 70 deposited thereon. According to another exemplary instance of the present disclosure, a second stabilizer layer 80 may be incorporated to overlie the superconductor layer 90, and in particular, overlie and contact capping layer 70. In instances, the second stabilizer layer 80 is in direct contact with the capping layer 70.

Figure 3:
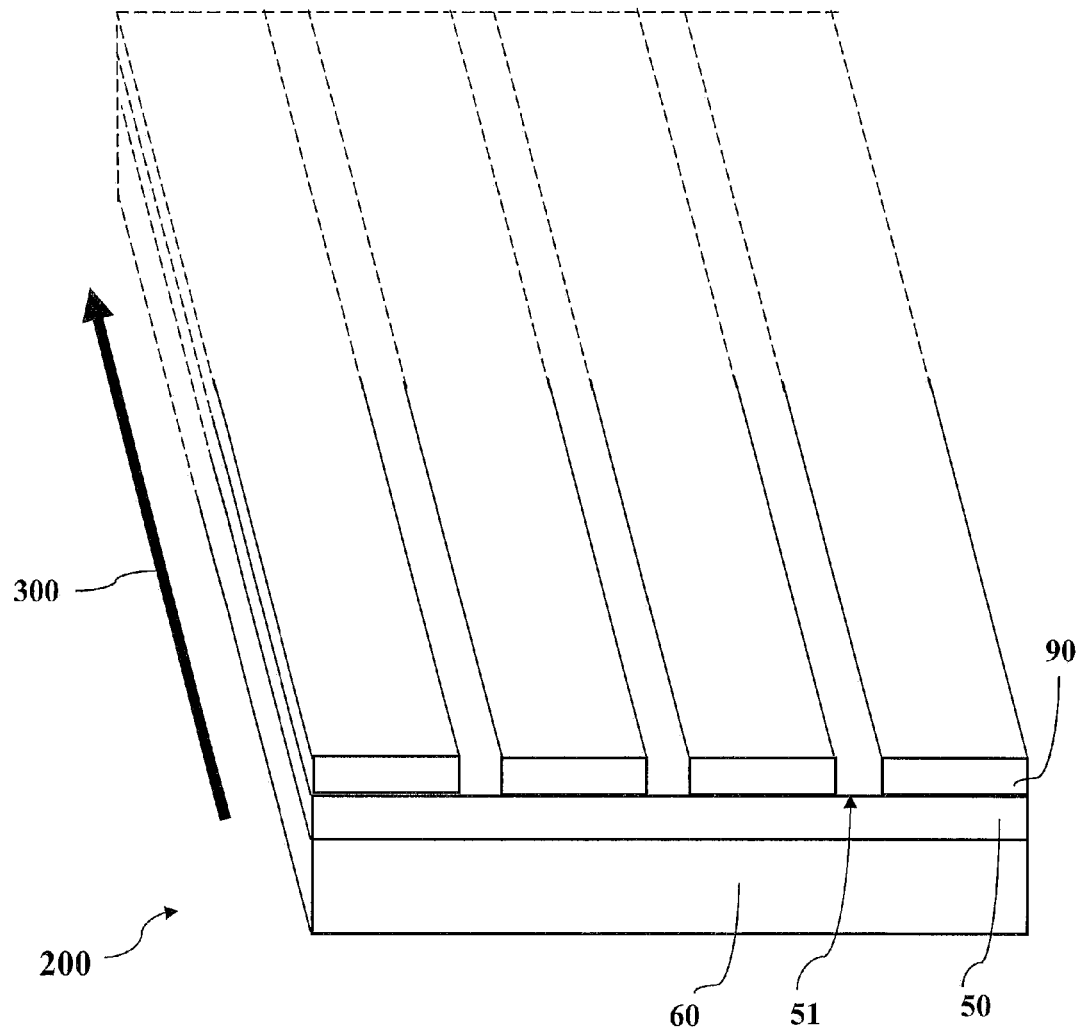
FIG. 3 illustrates a perspective view of a superconductor structure that comprises alternating superconducting filaments and insulating strips, according to an exemplary embodiment of the present disclosure.

As shown in FIG. 3, according to the present disclosure, HTS conductor 200 further includes at least one insulating strip(s) 20 and alternatively, HTS conductor 200 comprises a plurality of insulating strips 20. Insulating strips 20 may be filament-like structures or any other structures that extend continuously along the length of HTS conductor 200, as discussed previously. Insulating strips 20 are arranged substantially parallel to one another and substantially parallel to the current flow 300 within HTS conductor 200.

The at least one insulating strip 20 preferably extends along the entire length of HTS conductor 200. For example, the length of insulating strip 20 can be at least about 100 m, alternatively, about 500 m, and in certain instances, the insulating strip 20 may have a length of about 1 km or more. Without limitation by any theory, it may be understood that insulating strip 20 will correspond to about the length of HTS conductor 200. In an alternate embodiment, insulating strips 20 are less than the length of conductor 200. The width of the insulating strip 20 is typically in the range of about 1 micron to about 250 microns; alternatively, the width of the insulating strip is between about 10 microns and about 200 microns, and in certain instances, between about 15 microns and about 100 microns. Further, in certain instances the width of insulating strips 20 are selected to optimize the critical current density while minimizing AC loss.

As shown in FIGS. 1-3, in the exemplary embodiment the insulating strips 20 are deposited on surface 51 of the at least one buffer layer 50. In instances, the insulating strips 20 divide superconducting layer 90 into multiple superconducting filaments 91, thus forming an array of superconducting filaments. Superconducting filaments 91 are comprised of superconducting material and, like insulating strips 20, superconducting filaments 91 continuously extend substantially parallel along the length of HTS conductor 200. The width of the filaments 91 are selected to optimize the critical current density while minimizing AC loss, as may be understood by an ordinarily skilled artisan, without limitation.

Insulating strips 20 exhibit substantially reduced or no superconductivity so as to isolate superconducting filaments 91 and thus reduce AC losses. In instances, insulating strips 20 prevent electric coupling of the superconductor filaments 91. The at least one insulating strip 20 comprises insulating material that exhibits high resistivity to electrical currents to maintain uncoupled superconducting filaments. Examples of suitable insulating materials include but are not limited to: magnesium, zinc, iron, molybdenum-based materials. In an exemplary embodiment of the disclosure, the insulating material has a resistivity greater than about 1 milli-ohm centimeter (mΩcm). Further, as understood by an ordinarily skilled artisan, any application-appropriate resistivity is within the scope of the disclosure without limitation. In certain instances, the insulating material of insulating strips 20 may be an oxide that does not form a superconducting material when subjected to a superconductor film coating process. In a non-limiting example, the insulating material may comprise a ceramic oxide such as magnesium oxide, or another application-appropriate oxide. In still other embodiments, the insulating material may be non-ceramic material that is not superconducting, is a poor conductor, and does not form a superconducting material when subjected to a superconductor film coating process.

In embodiments of the disclosure, HTS conductor 200 has certain performance parameters. In exemplary embodiments, the HTS conductor comprises a critical current of at least 200 A/cm over a length of at least 10 meters at 77 degrees Kelvin (K). In addition, HTS conductor 200 exhibits an AC loss of less than about 1 W/m measured at 77 K in an AC magnetic field of 100 mT and a frequency of 60 Hz applied perpendicular to the surface of conductor 200.

Figure 4A:
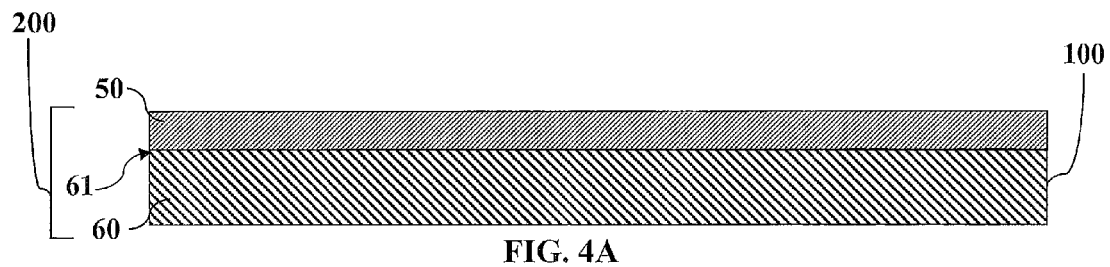
FIGS. 4A-E are illustrative drawings showing steps for an etch-free method of fabricating a multifilament HTS structure according to one embodiment of the present disclosure.

FIG. 4A-4E are illustrative drawings showing the successive steps for fabricating a multifilament AC tolerant conductor according the present disclosure. Non-limiting examples of materials and methods for depositing the same are set forth below. Referring to FIG. 4A, HTS conductor 200 is fabricated by first depositing buffer 50 on substrate 60 to form buffered substrate 100. Although this preliminary step is described in detail herein, it is not intended to be limiting, and it should be understood that any method of producing buffered substrate 100 generally known in the art or to an ordinarily skilled artisan may be used. Further, the present disclosure is not limited to the particular embodiments of buffered substrate 100 described herein. Substrate 60 provides support for HTS conductor 200. Substrate 60 may be a metal, a polycrystalline ceramic, an alloy or modification thereof, or a combination thereof. In an exemplary embodiment, substrate 60 is a metal and in certain instances, substrate 60 is an alloy of at least two metallic elements, such as but not limited to a Ni-based metal alloy. As may be appreciated by an ordinarily skilled artisan, the substrate material will vary according to the intended use of the superconducting article, and is not critical to the disclosure. Substrate 60 can be fabricated using any suitable translation process, without limitation, such as reel-to-reel translation.

As disclosed hereinabove the thickness of substrate 60 will vary according to the application. However, substrate 60 is typically in a tape-like configuration, having a high dimension ratio. Substrate 60 can be treated so as to have desirable surface properties for subsequent deposition of the constituent layers of the HTS tape. For example, the surface may be lightly polished to a desired flatness and surface roughness. Additionally, the substrate may be treated to be biaxially textured. One exemplary process for forming a biaxially textured substrate is the process RABiTS or roll assisted bi-axially textured substrates, as understood by an ordinarily skilled artisan.

Buffer layer 50 is disposed on surface 61 of substrate 6. Buffer layer 50 may be a single layer, or alternatively, be made up at least one additional film. In instances, the buffer layer 50 includes any biaxially textured film suitable for subsequent formation of an HTS layer. In certain instances, the buffer layer 50 supports the HTS layer to have desirable crystallographic orientation for superior superconducting properties. Such biaxial texturing may be accomplished by ion beam assisted deposition (IBAD), as is understood in the art, and as defined and described in U.S. Pat. No. 6,190,752, which is incorporated herein by reference for all purposes. Without limitation by any theory, MgO is a material for forming the IBAD film. In certain embodiments, buffer layer 50, for example comprising IBAD film without limitation, may be on the order of about 50 Angstroms to about 500 Angstroms, alternatively from about 50 Angstroms to 200 Angstroms, and in further instances from about 50 Angstroms to about 100 Angstroms. Although not specifically illustrated, buffer layer 50 may also include additional films to isolate substrate 60 from the epitaxial film or to reduce a mismatch in lattice constants between the HTS layer and the epitaxial film. In certain instances, if substrate 60 comprises a biaxially textured surface, buffer layer 50 is may be epitaxially grown on the textured substrate 60 so as to preserve biaxial texturing in buffer layer 50, without limitation.

Figure 4B:
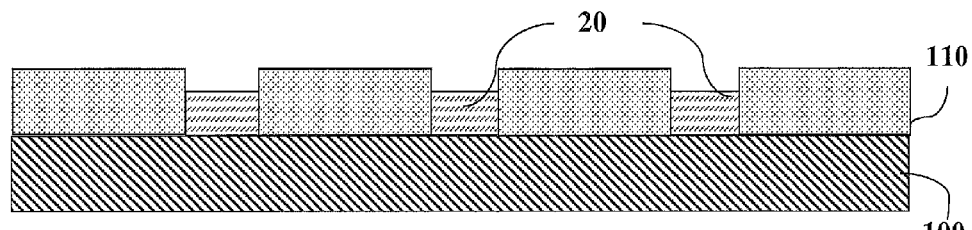

Referring to FIG. 4B, insulating strips 20 are deposited on the surface of buffered substrate 100. In keeping with the present disclosure, insulating strips 20 may be deposited by either chemical or physical deposition techniques, via mask 110 onto either a stationary or moving buffered substrate 100, or by printing techniques such as inject printing, screen printing, and the like. Without limitation by theory, the insulating strips 20 may be any as described hereinabove and may be formed by any method known to an artisan.

In an exemplary embodiment of the disclosure, one method for insulator strip deposition would include use of a mask 110. To deposit the at least one insulating strip 20 on surface of buffered substrate 100, insulating material is deposited through the openings of mask 110 while buffered substrate 100 is moving below mask 110. Preferably, mask 110 is not in contact with surface of buffered substrate 100, but rather is in close proximity to the surface. Insulating material is deposited through mask 110 in a deposition zone utilizing, for example, magnetic sputtering as a deposition technique. Using this technique, the insulating material may be deposited at an operating pressure of less than about 1 millitorr. Without limitation by any theory, lowest operating pressure possible may be used in order to provide insulating strips 20 with precise, sharp edges. The deposition of insulating strips through mask 110 may also be carried out using other deposition processes known to an ordinarily skilled artisan, without limitation.

Figure 4C:
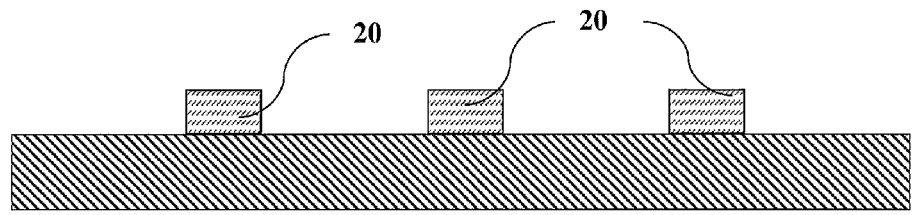

A technique wherein a mask 110 is physically attached to the surface of buffered substrate 100 prior to deposition of the insulating material can also be used, followed by a step wherein the mask 110 is lifted from surface once insulating strips 20 have been deposited. Further, in certain instances, insulating strips 20 generally have a thickness within a range of about 0.5 to about 30 microns, most typically about 2 to about 20 microns, and preferably about 1 to about 10 microns as disclosed herein previously. As such, it may be understood FIG. 4C illustrates buffered substrate 100 with insulating strips 20 after mask 110 has been removed.

Figure 4D:
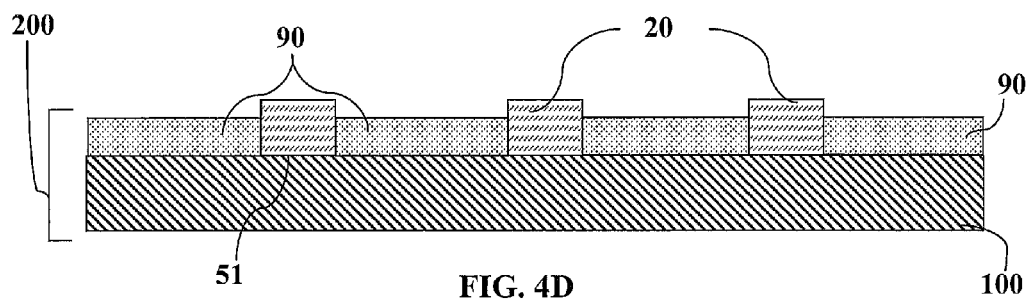

Next, as shown in FIG. 4D, material is deposited onto buffered substrate 100 to form superconductor layer 90. According to the present disclosure, when depositing the superconducting layer 90, the material coats only on surface 51 of buffered substrate 100 that is exposed. The material that coats the insulating strips 20 is of high resistivity, and has no superconducting properties. Only material on the substrate surface 51 between the insulating strips 20 is superconducting, thus resulting in a controlled filamentization of HTS conductor 200 to create superconducting filaments and is illustrated as 91 in subsequent FIG. 4E. The deposition of superconducting material on surface 51 between the insulating strips 20 prevents the electric coupling of the superconducting filaments 91. Uncoupled or electrically disconnected superconducting filaments 91 are preferred in the present disclosure in order to achieve the present benefits of a multifilament superconductor 200.

The process of this disclosure may be practiced with any known HTS material. Although not critical to the practice of the disclosure, superconducting layer 90 generally has a thickness within a range of about 1 to about 30 microns, most typically about 2 to about 20 microns, and preferably about 2 to about 10 microns, in order to get desirable amperage ratings. Superconducting layer 90 may be chosen from any of the high-temperature superconducting materials that exhibit superconducting properties above the temperature of liquid nitrogen, 77 K, and preferably an oxide superconductor. One class of materials includes $REBa_2Cu_3O_{7-x}$ where RE is a rare earth element, such as Y, and related compounds. Such materials may also include, for example, $Bi_2Sr_2Ca_2Cu_3O_{10+y}$, $Ti_2Ba_2Ca_2Cu_3O_{10+y}$, and $HgBa_2Ca_2Cu_3O_{8+y}$. Of the foregoing, $YBa_2Cu_3O_{7-x}$, also generally referred to as YBCO, may be utilized in certain instances. Further, the deposition of superconducting layer 90 is carried out using any application-appropriate deposition process known to an ordinarily skilled artisan and for example, both thick and thin film forming techniques may be employed, without limitation.

Without limitation by any theory, the superconductor material preferentially is continuously coated on the surface 51 of buffered substrate 100 rather than insulator strips 20, this fabrication technique provides certain benefits and ease to scale up to long lengths. That is, because the superconductor material does not coat insulation strips 20 as a continuous film, it is not necessary to introduce polishing/etching steps such as those found in previous fabrication methods to remove the superconducting material from the surface of insulation strips 20 and as discussed herein. If it were necessary to do so and not done, coupling of superconducting filaments 91 would result thereby negating the benefit of creating a multifilament HTS conductor 200 as disclosed herein.

Figure 4E:
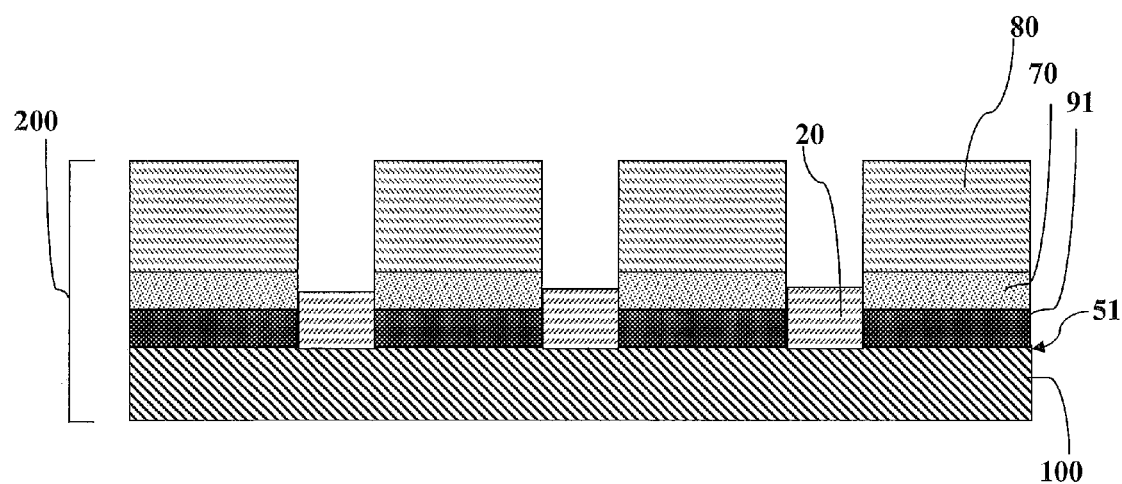

As shown in FIG. 4E, electrodeposition techniques known in the art may be employed to deposit a first stabilizer layer, or capping layer, 70 on the surface of superconducting filament 91, followed by electrodeposition of a second stabilizer layer 80. Capping layer 70 and second stabilizer layer 80 are generally implemented for electrical stabilization. More particularly, both capping layer 70 and second stabilizer layer 80 aid in continued flow of electrical charges along HTS conductor 200 in cases where cooling fails or the critical current density is exceeded, and superconducting filament 91 moves from the superconducting state and becomes resistive.

According to the present disclosure, the resistivity of superconducting filaments 91 is orders of magnitude less than that of insulating strips 20. Therefore, the architecture of HTS tape 200, with alternate superconductor filaments and insulation strips, provides for preferential electrodeposition of capping layer 70 and stabilizer layer 80 only on superconductor filaments 91. The present disclosure thus avoids any coupling of superconductor filaments and preserves the advantage of filamentization for lower AC losses. As may be understood, a noble metal may be utilized for capping layer 70 to prevent unwanted interaction between stabilizer layer 80 and HTS layer 91. Typical noble metals include gold, silver, platinum, palladium, and combinations thereof, without limitation. In certain instances, silver may be used to reduce cost and improve general accessibility. Capping layer 70 is preferably thin for cost reasons, but thick enough to prevent unwanted diffusion of the components from stabilizer layer 80 into HTS layer 91. Typical thicknesses of capping layer 70 range within about 0.1 microns to about 100 microns; in instances within about 0.1 microns and about 10 microns; and in certain instances about 1.5 microns to about 3.0 microns, without limitation.

Referring again to FIG. 4E, second stabilizer layer 80 may be deposited. Second stabilizer layer 80 is preferably copper and functions as a thick stabilizer. In accordance with this disclosure, electrochemical deposition techniques, such as electroplating, may be used to fully coat and encapsulate conductor 200 with a suitable, stabilizer to form second stabilizer layer 80 on the exposed areas of capping layer 70. In order to provide adequate current-carrying capability in the stabilizer layer, typically second stabilizer layer 80 has a thickness within a range of about 1 to about 1,000 microns, most typically within a range of about 10 to about 400 microns, such as about 10 to about 200 microns. Particular embodiments had a nominal thickness within a range of about 20 microns to about 50 microns, without limitation.

According to a particular feature of the embodiment, an electroplating technique defined and described in U.S. Pub. No. 2006/0079403 (Ser. No. 11/130,349), which is incorporated herein by reference, may be used to form stabilizer layer 80. According to this technique, because capping layer 70 is conductive, electroplating may be carried out at a high rate of deposition, typically at a rate of about 1 micron per minute or higher, to quickly build-up a thick stabilizer layer 80 on the superconducting tape. More particularly, capping layer 70 functions as a seed layer for deposition of copper, or other metal, thereon. While the foregoing generally references copper, it is noted that other metals, including aluminum, silver, gold, and other thermally and electrically conductive metals may also be utilized as a secondary stabilizer to form stabilizer layer 80. However, it is generally desirable to utilize a non-noble metal to reduce overall materials cost for forming the superconductive tape. Although the particular example disclosed herein makes reference to standard electroplating techniques, there is no particular limitation on electrochemical deposition methods utilized. In accordance with this disclosure, stabilizer layer 80 may overlie one of the two opposite major surfaces of the substrate, both major surfaces, or may completely encapsulate the substrate, buffer layer, and superconductor layer. However, due to the high resistivity of the insulating strip 20, it is not coated with the stabilizer layer. By leaving insulating strips 20 uncoated, coupling of superconducting filaments is prevented.

Figure 5:
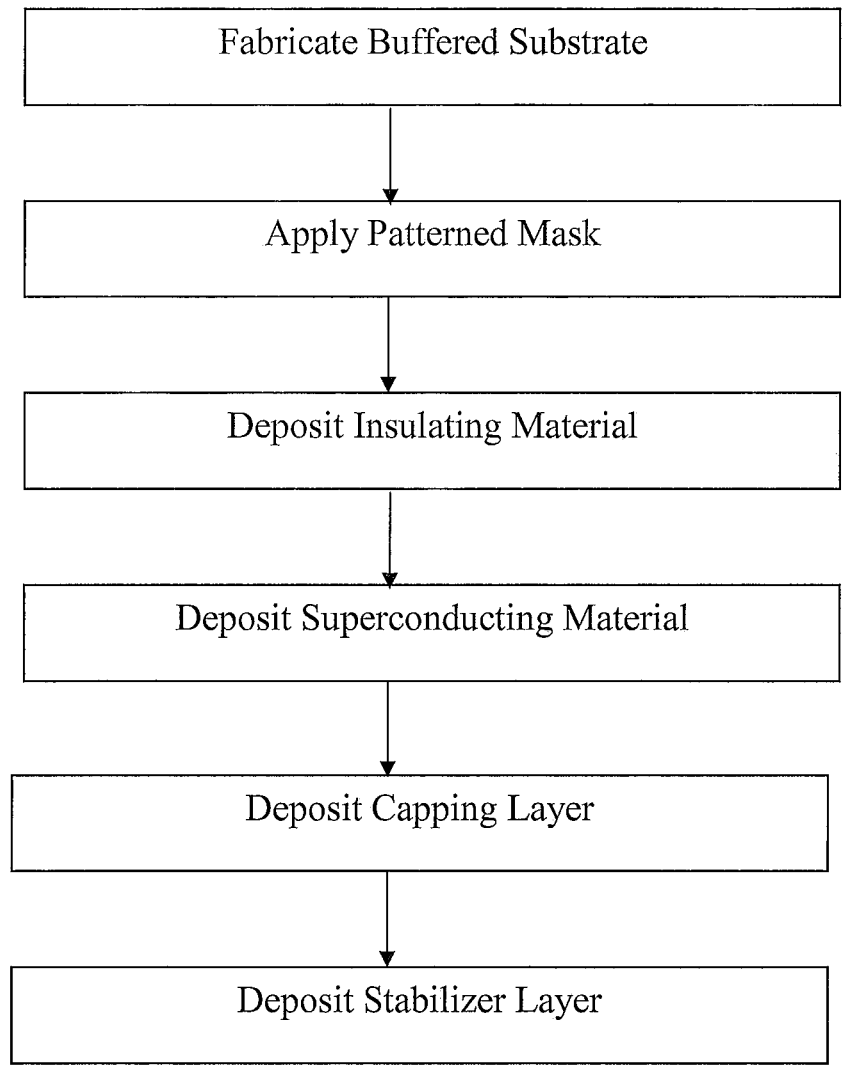
FIG. 5 illustrates a flow chart of the steps which comprise a fabrication process as described herein for one embodiment of the present disclosure.

As described above, a completely etch-free process is possible to fabricate a multi-filamentary 2G HTS wire that is robust and scalable to long lengths with a high yield. According to specific embodiments of the disclosure, HTS tape 200 comprises 400 µm wide superconducting filaments 91 and 100 µm wide insulator strips 20. In this embodiment, about 20% of the superconductor cross section is not available for current flow. To maximize current carrying capacity, the width of insulator strips 20 is minimized. Therefore, in a preferred embodiment of the disclosure, HTS tape 200 comprises 100 µm wide superconducting filaments 91 separated by 10 µm wide insulator strips 20, which results in an AC loss reduction factor of 40 with only a 10% reduction in critical current flow. In additional embodiments of the disclosures, a superconducting structure is created, which results in even further reduction in AC losses. For example, in one embodiment, ferromagnetic material is incorporated into insulating strips 20 in order to further decrease AC losses. A flow chart of the individual steps which comprise an embodiment of the novel etch-free fabrication process as described hereinabove are illustrated in FIG. 5.

Figure 6A:
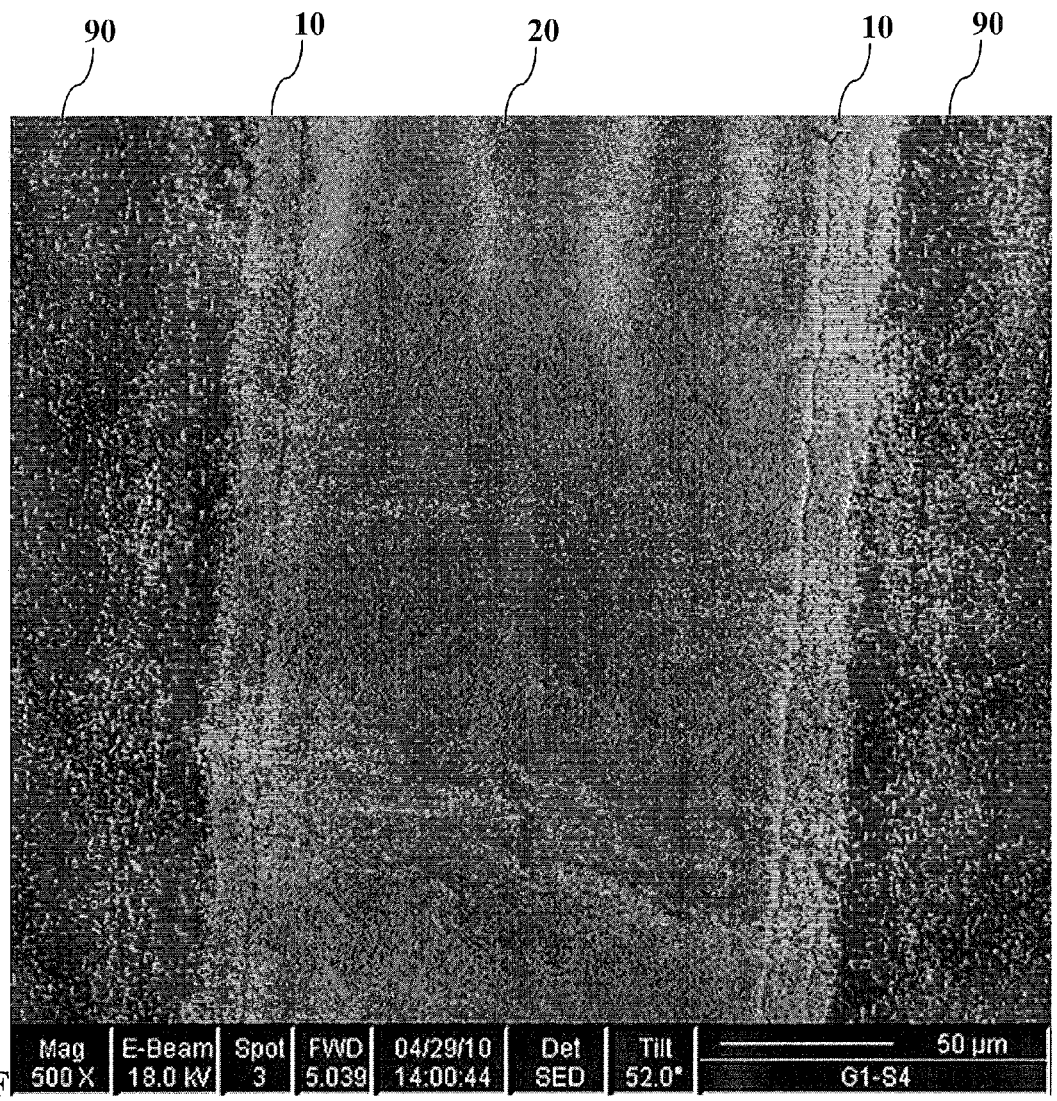
FIG. 6A-B show photographs of the differential deposition of a coating material across an insulating strip and adjacent superconducting material according to one embodiment of the present disclosure.
Figure 6B:
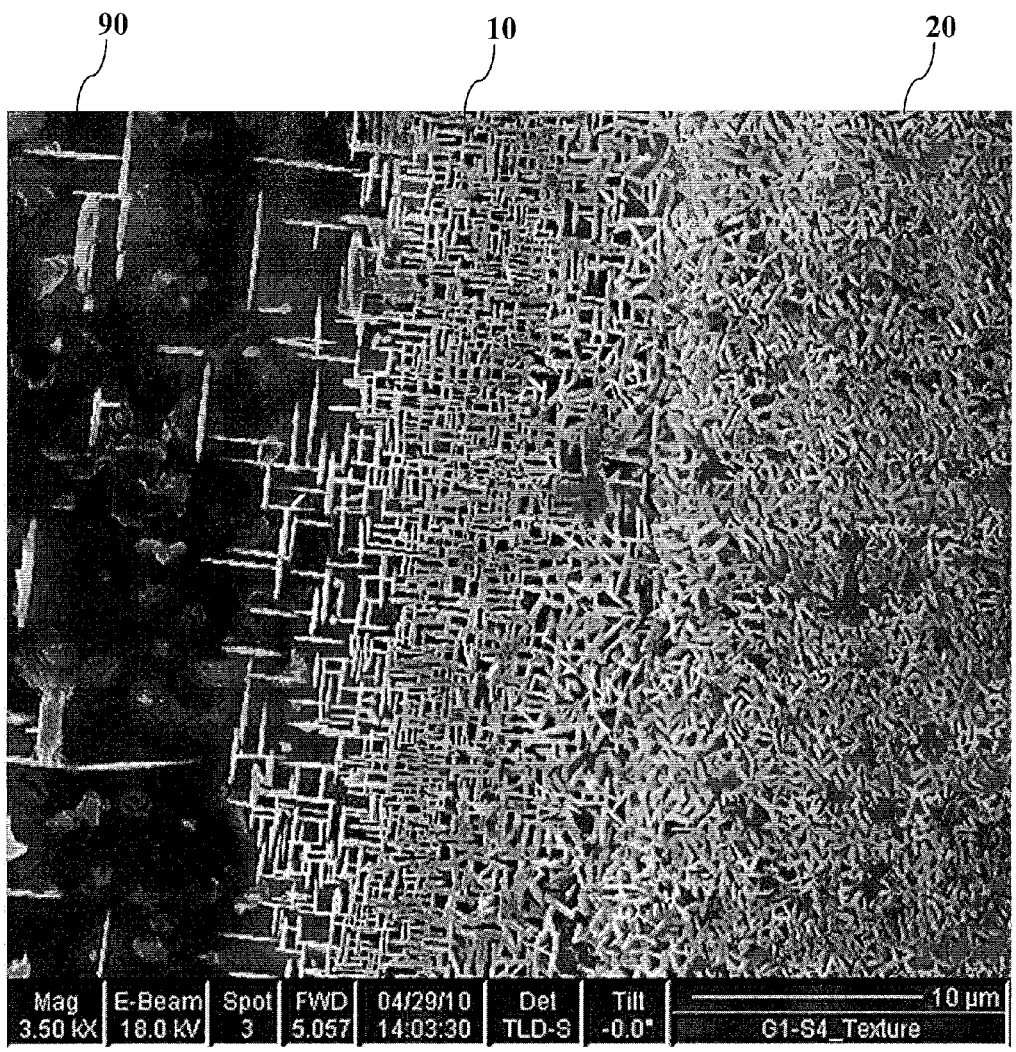

FIGS. 6A and B show photographs of the microstructure of an embodiment of the disclosure. Specifically, FIG. 6A shows a 500× magnification of a portion of an embodiment of the disclosure, specifically an insulating strip 20 with a superconducting layer 90 on each side, and associated transition layers 10. FIG. 6B shows a 3,500× magnification of the same material showing more detail of the microstructure of the superconducting layer 90, insulating strip 20, and transition 10 between them. Clearly shown is the differential organization of the coating Materials after superconductor deposition.

Figure 7A:
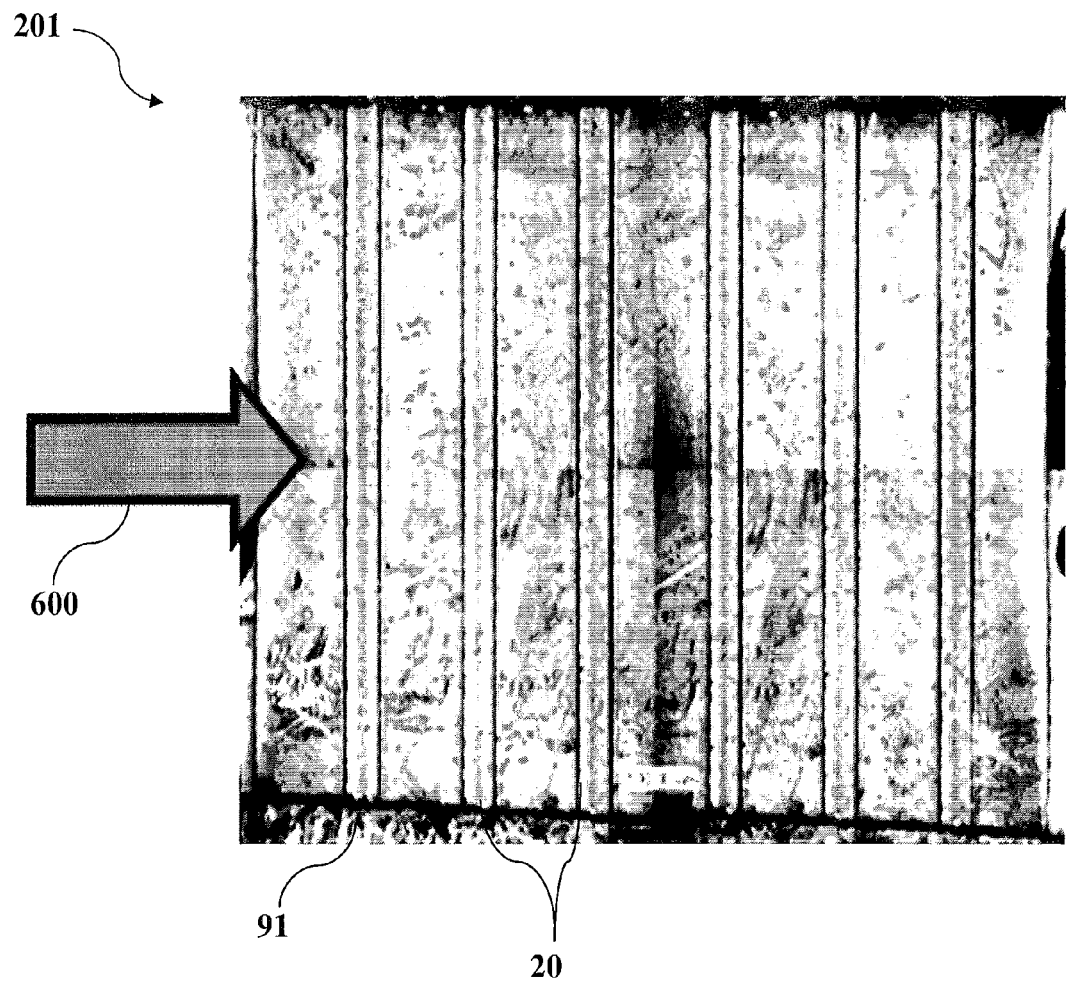
FIG. 7A-B show one embodiment of the disclosure used to test the resistance of the insulating strips to a current passing perpendicularly therethrough, and the resistance data generated therefrom.
Figure 7B:
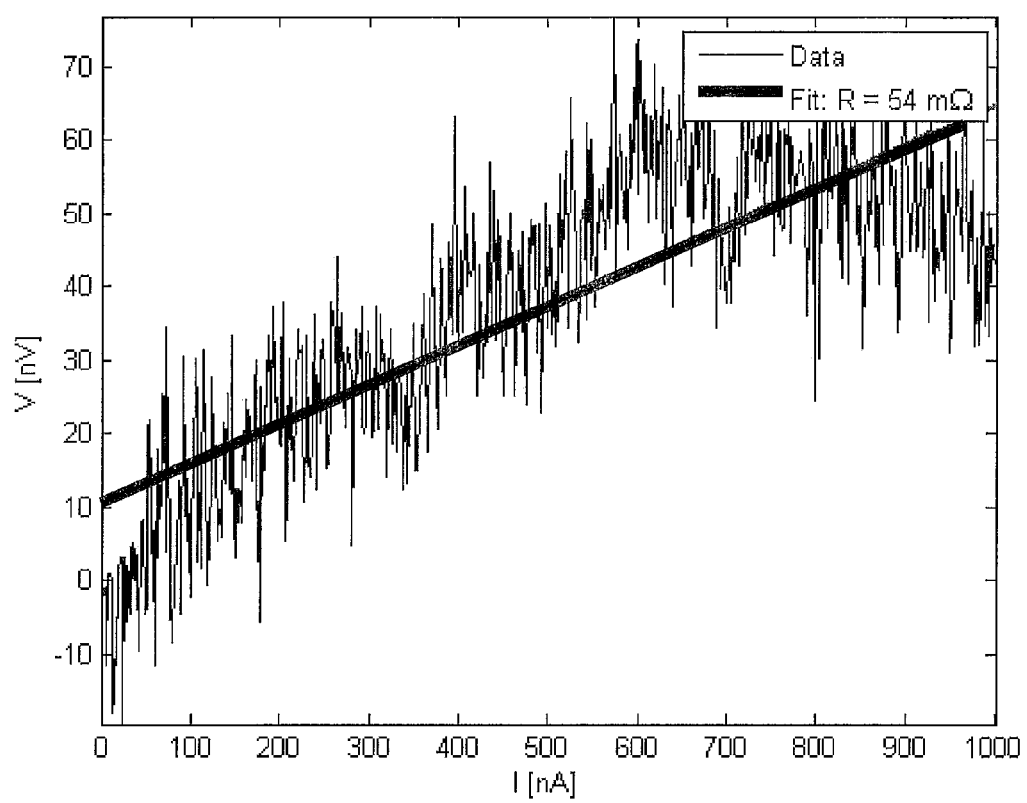

FIGS. 7A and B show the results of a resistivity test of one embodiment of the tape 201 disclosure. Specifically, FIG. 7A shows the alternating filamentous structure of the tape 201 of the disclosure, namely a superconducting filament 91 alternating with an insulating strip 20. At a time when not conducting current 300, varying amounts of voltage were applied across the tape 201, or passed through the tape 201, perpendicular to the direction that the filaments 91 run and the direction of current flow 300 during operation. The resulting amperage was measured across the disclosed wires or tape 201, for example in the direction of current flow 600 illustrated by the arrow in 7A. FIG. 7B shows a plot of the resistivity data and shows that the insulating material 20 was found not to have any superconducting material that would carry a current of even just 10 nA, and the tape 201 had a resistance of approximately 54 mΩ.

Figure 8A:
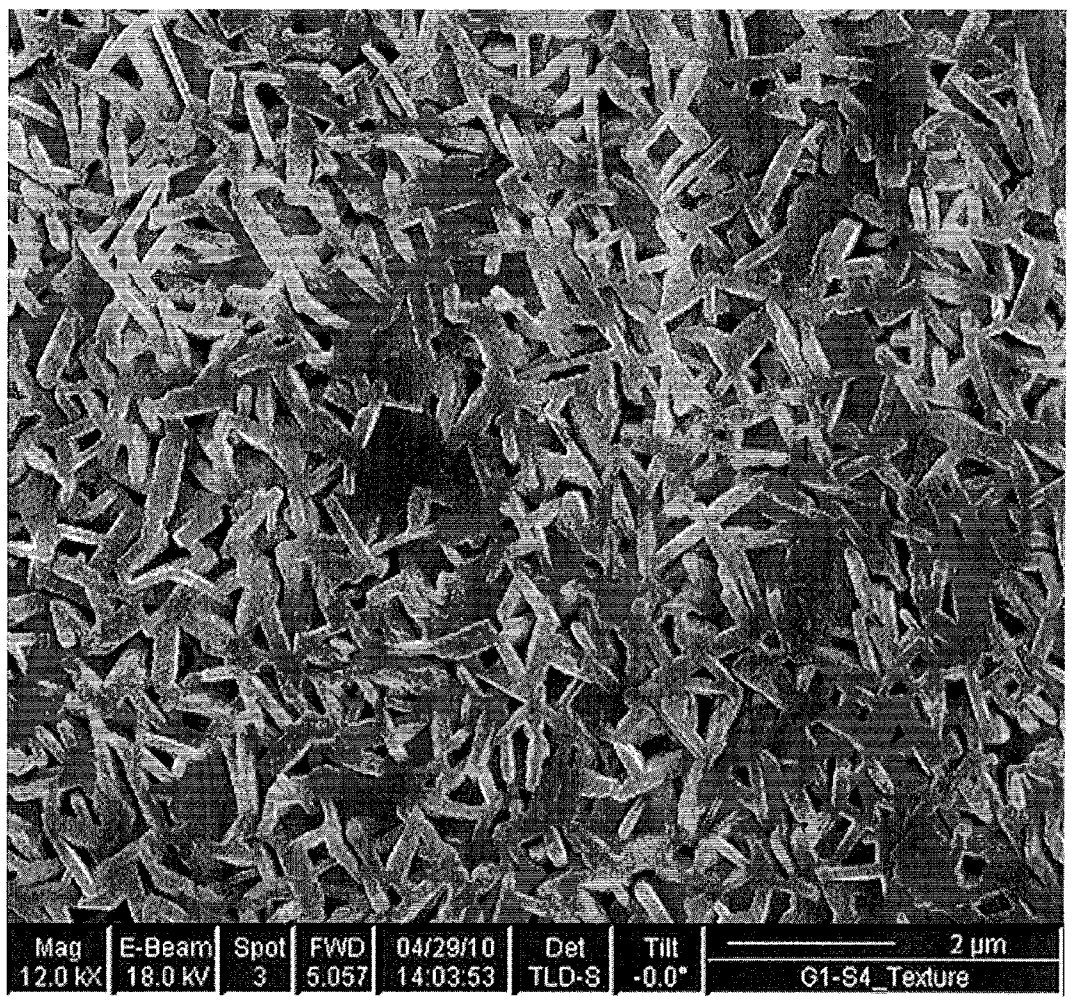
FIG. 8A-B show the microstructure of the insulating material affects electrodeposition of a silver capping layer according to one embodiment of the disclosure.
Figure 8B:
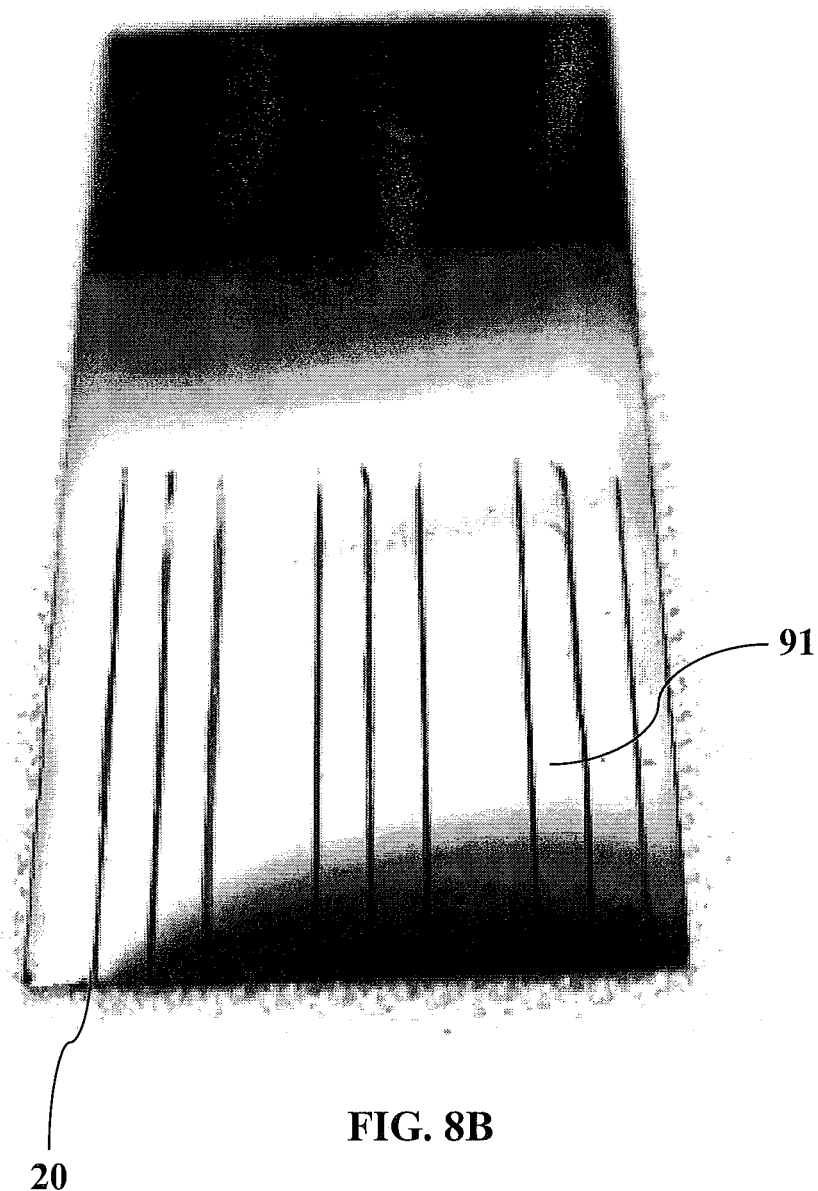

FIGS. 8A and B show the microstructure of a coated material within the scope of the disclosure and how this structure affects subsequent electrodeposition of silver onto the material. FIG. 8A shows the microstructure of a coating material on an insulating strip made of magnesium oxide and FIG. 8B shows the results of s silver electrodeposition on the same material. It can clearly be seen that the silver did not adhere to the highly resistant material coated on the insulating strips 20, while strongly adhering to the superconducting portions 91 of the material.

Figure 9A:
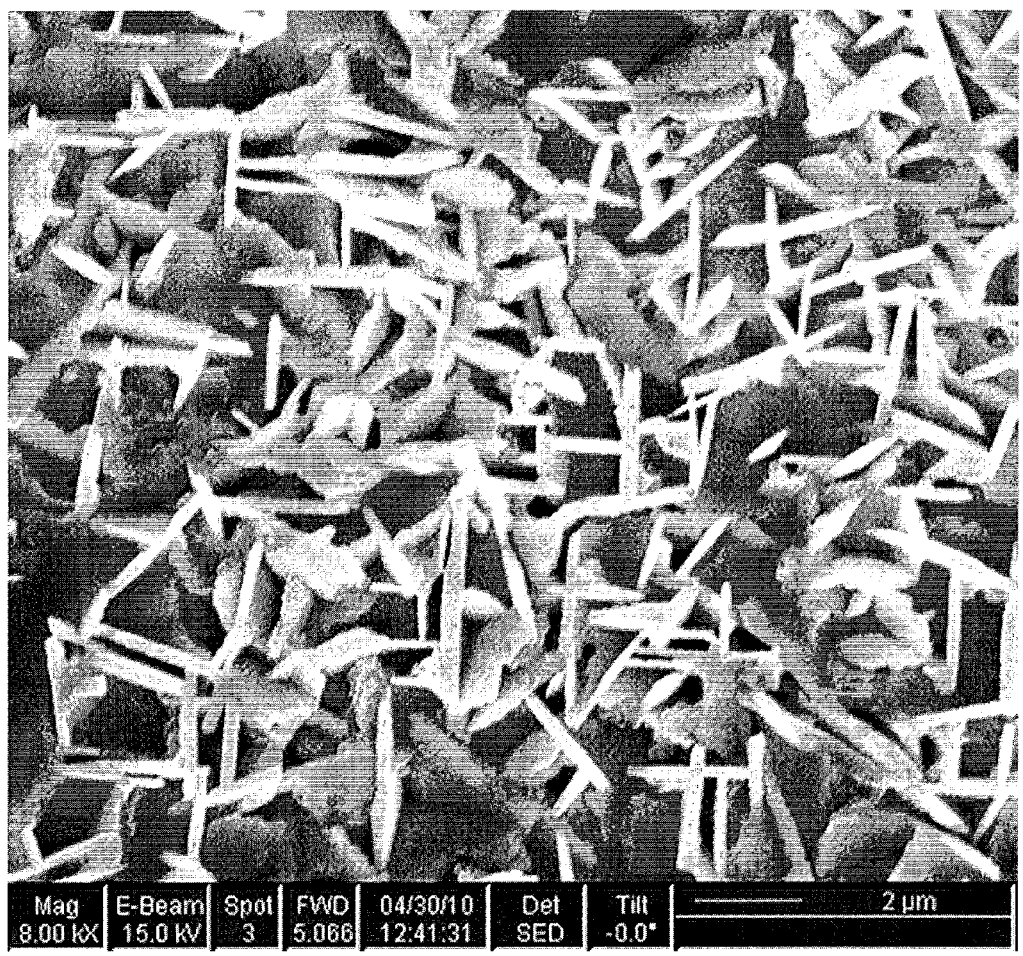
FIG. 9A-B show a material outside the scope of the disclosure and how the microstructure of the insulating material affects electro-deposition of a silver capping layer according to one embodiment of the disclosure.
Figure 9B:
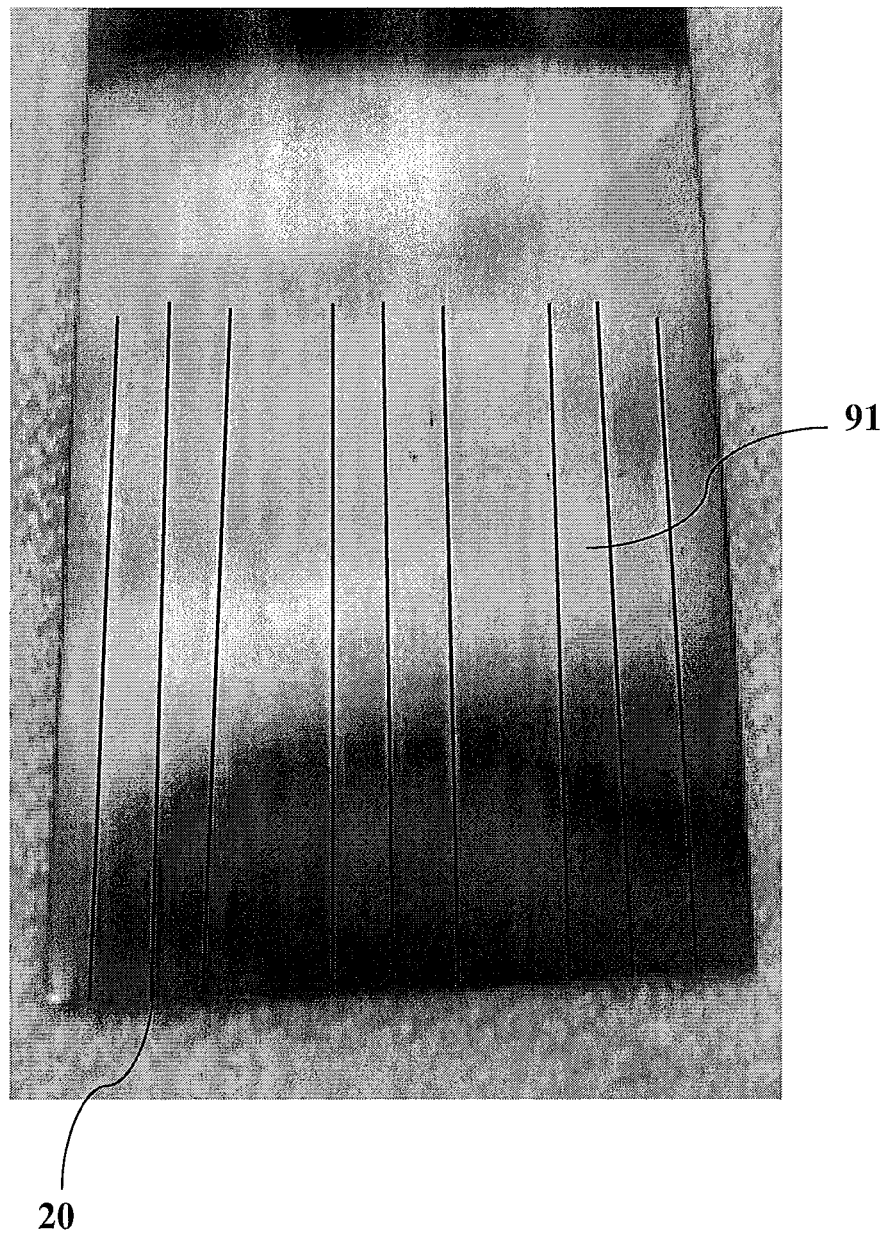

FIGS. 9A and B show the microstructure of a coated material and how this structure affects subsequent electrodeposition of silver onto the material. Specifically, FIG. 9A shows the microstructure of a coating material on an insulating strip 20 made of yttria, and FIG. 9B shows the results of silver electrodeposition on the same material. It is clear that the silver adheres much more freely across the entirety of the material, as compared to the material shown in FIG. 8B. Because the material coated on yttria has a low resistance, the silver adheres to both the superconducting 91 and insulating 20 regions of the material, thus coupling the superconducting filaments and rendering the filamentized structure useless for AC loss reduction.

Figure 10:
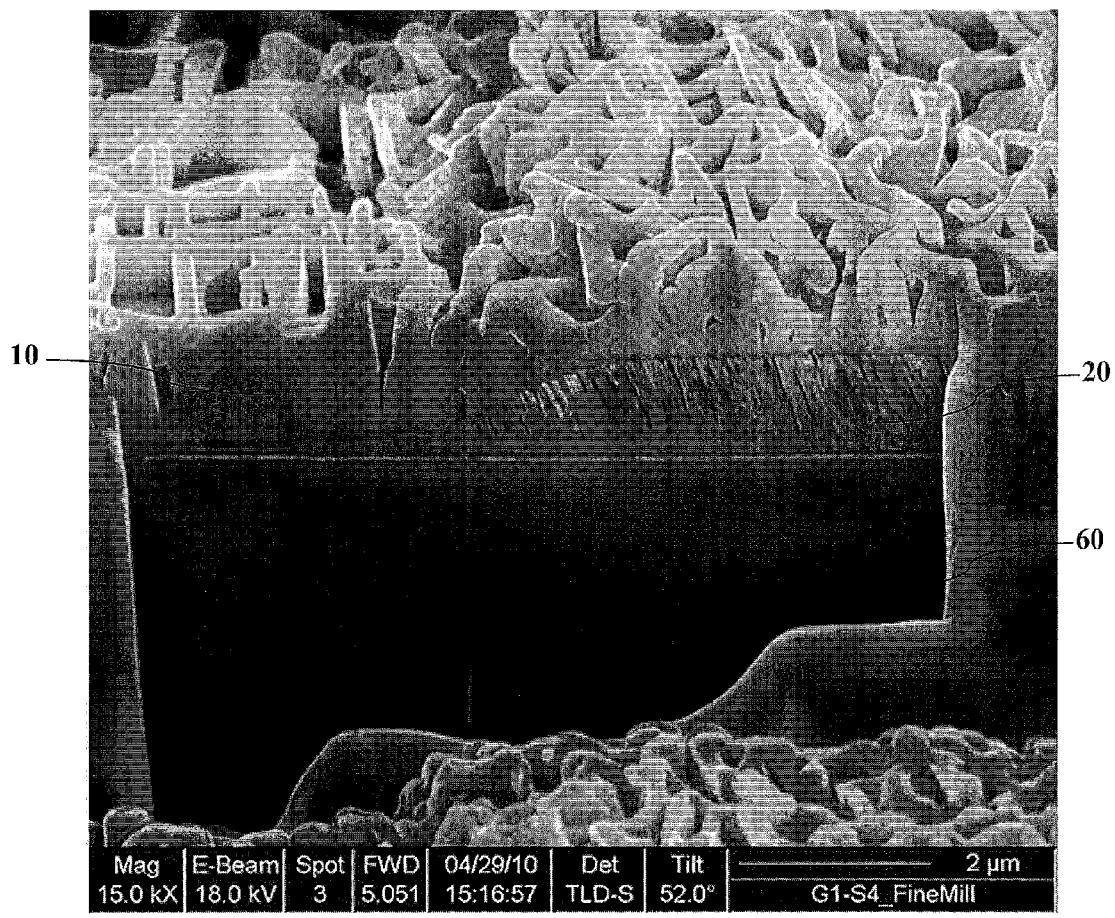
FIG. 10 shows a cross-section of a tape consisting of the insulating strip and a coated material on a metal substrate according to one embodiment of the disclosure.

FIG. 10 shows a cross section of a tape consisting of the insulating strip 20 composed of magnesium oxide and a coated material on a metal substrate 60. The transition region 10 adjacent to the insulating strip 20 is also shown.

Figure 11:
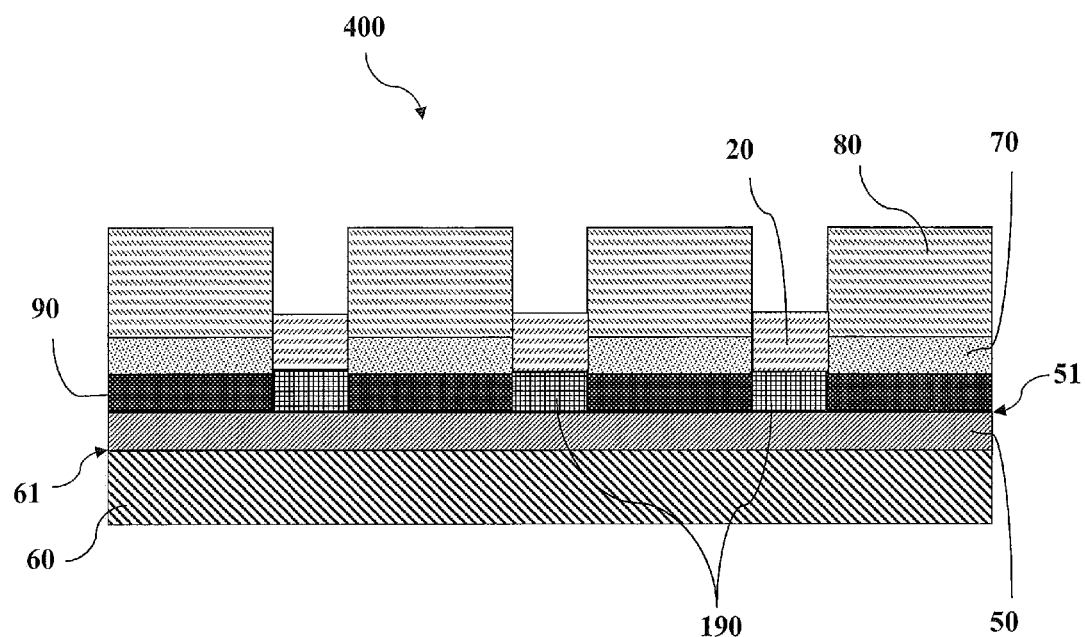
FIG. 11 shows a cross-sectional schematic of a tape consisting of the insulating strip and a coated material on a metal substrate according to one embodiment of the disclosure.

Referring now to FIG. 11, in an alternate embodiment of the present disclosure, it may be understood that the insulating strips 20 are coated, not on the buffer 50 coated substrate 60, but rather on the superconducting layer 90. The same materials disclosed herein that are used for insulating stripes 20 on the buffer substrate can be coated on the superconducting layer 90 without limitation. In this alternate exemplary embodiment, following deposition of the insulating strips 20 on the superconducting layer 90, the tape 400 is subjected to a heat treatment to promote diffusion of the constituents of the insulating layer 20 into the superconducting layer 90 directly below. The temperature of such a heat treatment may range from about 300° C. to about 900° C.; alternatively, from about 400° C. to about 700° C. In certain instances, the time of this heat treatment may range from about 10 minutes to about 20 hours. As may be understood by an ordinarily skilled artisan, the heat treatment period may at least partially depend on the insulating material, the superconducting material, and controlling the rate of temperature change to reach the heat treatment temperature. Without limitation by any theory, during this heat treatment, superconducting film beneath the insulating stripes is deleteriously affected resulting in conversion to a non-superconducting material 190.

The alternate method just described provides an additional method to produce a HTS-wire or tape structure 400 illustrated in FIG. 11. The superconducting filaments 90 separated by non-superconducting material 190 according to this disclosure. After the heat treatment, a stabilizing layer 70 is deposited on the tape by a process such as electro-deposition, as described previously herein. Since the insulating strips 20 atop the non-superconducting 190 are highly resistive, the silver will coat only the superconducting filaments 90 and not the insulating strips 20. Subsequent stabilizer coating 80, such as but not limited to thick copper, may be deposited on the tape 400 by a process such as electro-deposition, as described herein previously. Again, since the insulating strips 20 atop the non-superconducting material 190 are highly resistive, the copper will coat only the silver covered superconducting filaments 90 and not the insulating strips 20. Hence, even by this alternate embodiment, a multifilament superconductor 400 with fully-striated stabilizers is created without any etching involved.

As such, without limitation by any theory, the structure may comprise a series of layers as illustrated in FIG. 11. Referring again to FIG. 11 the cross-sectional view of an HTS conductor 400 having a multi-layer composition. In instances, the superconducting layer 90 is deposited on at least one buffer layer 50. As described herein, the insulating strips 20 may be deposited over the superconducting layer 90 prior to heat treatment. After heat treatment a non-superconducting material 190 is formed in the superconducting layer 90. As such, and in accordance with the disclosure, HTS conductor 400 includes generally a substrate 60, at least one buffer layer 50 overlying surface 61 of the substrate 60, a superconducting layer 90 overlying surface 51 of the at least one buffer layer 50. The superconductor layer 90 has a first stabilizer layer or capping layer 70 deposited thereon. According to another previously described embodiment of the present disclosure, a second stabilizer layer 80 may also be incorporated, to overlie the superconductor layer 90, and in particular, overlie and contact capping layer 70. In instances, the second stabilizer layer 80 is in direct contact with the capping layer 70.

While absence of etching provides an advantage of the disclosed embodiments herein, it may be understood by an ordinarily skilled artisan that at least one etching step may be utilized to remove insulating or superconducting micro-filament defects, deposition flaws, contamination, and generally improve the multifilament structure and method of making disclosed in this invention. An ordinarily skilled artisan may recognize that such an etching step may be within the scope of the disclosure as a means of quality control, post-formation repair, or refurbishing of an HTS conductor 200, without limitation. Further, one of ordinary skill in the art will readily appreciate that HTS conductor 200 can be incorporated into commercial power components, such as a power cables, power transformers, power generators, and power grids without limitation for a variety of applications and purposes.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, ... 50 percent, 51 percent, 52 percent ... 95 percent, 96 percent, 97 percent, 98 percent, 99 percent, or 100 percent. Moreover, any numerical range defined by two R numbers as defined in the above is also specifically disclosed. Use of broader terms such as "comprises", "includes", and "having" should be understood to provide support for narrower terms such as "consisting of", "consisting essentially of", and "comprised substantially of". Accordingly, the scope of protection is not limited by the description set out above but is defined by the claims that follow, that scope including all equivalents of the subject matter of the claims. Each and every claim is incorporated as further disclosure into the specification, and the claims are embodiment(s) of the present invention. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural or other details supplementary to the disclosure.

We claim:

1. A superconductor structure comprising:
    a substrate on which at least one buffer layer is deposited, said substrate having a length and a width, wherein the substrate has a dimension ratio of not less than about $10^2$;
    a superconductor layer on said at least one buffer layer, said superconducting layer consisting of superconductor material that forms at least two substantially parallel superconductor filaments that continuously extend along the length of said substrate;
    wherein the at least two superconductor filaments are separated from each other by a gap in which at least one insulating strip is deposited, the at least one insulating strip having a first and second surface opposite each other, said first surface overlying said buffer layer and said second surface being substantially free of said superconductor material, the insulating strip being disposed exclusively between the at least two superconductor filaments;
    wherein the at least one insulating strip continuously extends along the length of said substrate and is comprised of insulating material with a resistivity greater than about 1 mΩcm; and
    at least one stabilizing layer overlying the superconductor layer having a thickness of at least 5 microns;
    wherein the stabilizer layer does not directly contact the insulating strip to couple the at least two superconductor filaments.

2. The structure according to claim 1 wherein the at least two superconductor filaments have a critical current of at least 200 A/cm over a length of at least 10 meters.

3. The structure according to claim 1 wherein said at least two superconducting filaments are uncoupled.

4. The structure according to claim 1 wherein said superconductor filaments have a width in of at least about 50 μm.

5. The structure according to claim 1 wherein said insulating material additionally comprises ferromagnetic material.

6. The structure according to claim 1 wherein said insulating strips have a thickness in the range of about 0.5 to about 30 microns.

7. The structure according to claim 1 wherein said insulating strips have a width in the range of about 1 micron to about 250 microns.

8. The structure according to claim 1 wherein the at least one stabilizer layer further comprises a first stabilizer layer and a second stabilizer layer respectively overlying the superconductor layer.

9. The structure according to claim 8 wherein the first stabilizer layer has a thickness within a range of about 0.1 microns to about 10.0 microns.

10. The structure according to claim 8 wherein the second stabilizer layer has a thickness within a range of about 1 micron to about 1,000 microns.

11. The superconductor article of claim 8 wherein the second stabilizer layer is electroplated.

12. The structure according to claim 8, wherein the first stabilizer layer comprises a noble metal.

13. The structure according to claim 12, wherein the noble metal is Ag.

14. The structure according to claim 8, wherein the second stabilizer layer comprises a non-noble metal.

15. The structure according to claim 14, wherein the non-noble metal comprises a material from the group consisting of copper, aluminum, and alloys thereof.

16. The structure according to claim 15 wherein the non-noble metal is copper.

17. The structure according to claim 16 with an AC loss less than 1 W/m measured at 77 K in an AC magnetic field of 100 mT and a frequency of 60 Hz applied perpendicular to a surface of said structure.

18. The structure according to claim 1 wherein said multifilament superconductor layer comprises a high temperature superconductor material, having a critical temperature Tc not less than about 77 K.

19. The structure according to claim 1 wherein said multifilament superconductor layer comprises $REBa_2Cu_3O_{7-x}$, wherein RE is a rare earth element.

20. The structure according to claim 19 wherein the multifilament superconducting layer is selected from the group comprising $YBa_2Cu_3O_{7-x}$, $Bi_2Sr_2Ca_2Cu_3O_{10+y}$, $Ti_2Ba_2Ca_2Cu_3O_{10+y}$, $HgBa_2Ca_2Cu_3O_{8+y}$, and combinations thereof.

21. The structure according to claim 1 wherein the buffer layer comprises a biaxially crystal textured film having generally aligned crystals both in-plane and out-of-plane of the film.

22. The structure according to claim 1 wherein the at least one stabilizer layer extends so as to define first and second side surfaces that encapsulate the structure.

23. The structure of according to claim 1 wherein the substrate has a length of at least about 100 m.

24. The structure according to claim 1 wherein said insulating material is a ceramic oxide.

25. The structure according to claim 24 wherein said ceramic oxide is selected from the group consisting of magnesium oxide, iron oxide, molybdenum oxide, manganese oxide, zinc oxide, chromium oxide, silicon oxide, and combinations thereof.

26. A superconductor structure comprising:
    a substrate on which at least one buffer layer is deposited, said substrate having a length and a width, wherein the substrate has a dimension ratio of not less than about $10^2$;
    a superconductor layer on said at least one buffer layer, said layer consisting of a superconductor material that forms at least two substantially parallel superconductor filaments, having a non-superconducting region deposited exclusively in between, and the superconductor filaments and non-superconducting region continuously extend along the length of said substrate;
    an insulating layer deposited exclusively on said non-superconducting region, wherein said insulating layer forms at least one insulating strip;
    wherein the at least one insulating strip continuously extends along the length of said substrate and is comprised of insulating material with a resistivity greater than about 1 mΩcm.

27. The structure according to claim 26 wherein the at least two superconductor filaments have a critical current of at least 200 A/cm over a length of at least 10 meters.

28. The structure according to claim 26 wherein said at least two superconducting filaments are uncoupled by heat treatment material deletion.

29. The structure according to claim 26 wherein said superconductor filaments have a width in of at least about 50 μm.

30. The structure according to claim 26 wherein said insulating material additionally comprises ferromagnetic material.

31. The structure according to claim 26 wherein said insulating strips have a thickness in the range of about 0.5 to about 30 microns.

32. The structure according to claim 26 wherein said insulating strips have a width in the range of about 1 micron to about 250 microns.

33. The structure according to claim 26 further comprising at least one stabilizer layer overlying the superconductor layer.

34. The structure according to claim 33 wherein the at least one stabilizer layer further comprises a first stabilizer layer and a second stabilizer layer respectively overlying the superconductor layer, and wherein the at least one stabilizer layer has a thickness of at least 5 microns.

35. The structure according to claim 34 wherein the first stabilizer layer has a thickness within a range of about 0.1 microns to about 10.0 microns.

36. The structure according to claim 34 wherein the second stabilizer layer has a thickness within a range of about 1 micron to about 1,000 microns.

37. The superconductor article of claim 34 wherein the second stabilizer layer is electroplated.

38. The structure according to claim 34, wherein the first stabilizer layer comprises a noble metal.

39. The structure according to claim 38, wherein the noble metal is Ag.

40. The structure according to claim 34, wherein the second stabilizer layer comprises a non-noble metal selected from the group consisting of copper, aluminum, and alloys thereof.

41. The structure according to claim 40 with an AC loss less than 1 W/m measured at 77 K in an AC magnetic field of 100 mT and a frequency of 60 Hz applied perpendicular to a surface of said structure.

42. The structure according to claim 26 wherein said multifilament superconductor layer comprises a high temperature superconductor material, having a critical temperature Tc not less than about 77 K.

43. The structure according to claim 26 wherein said multifilament superconductor layer comprises $REBa_2Cu_3O_{7-x}$, wherein RE is a rare earth element.

44. The structure according to claim 43 wherein the multifilament superconducting layer is selected from the group comprising $YBa_2Cu_3O_{7-x}$, $Bi_2Sr_2Ca_2Cu_3O_{10+y}$, $Ti_2Ba_2Ca_2Cu_3O_{10+y}$, $HgBa_2Ca_2Cu_3O_{8+y}$, and combinations thereof.

45. The structure according to claim 26 wherein the buffer layer comprises a biaxially crystal textured film having generally aligned crystals both in-plane and out-of-plane of the film.

46. The structure according to claim 26 wherein said at least one insulating strip is deposited on the superconductor layer by a process selected from the group consisting of deposition through a mask, ink jet printing, screen printing, stamping, patterning, and combinations thereof.

47. The structure according to claim 26 wherein the process for deposition through a mask is selected from the group consisting of sputtering, chemical vapor deposition, sol gel coating, evaporation and laser ablative deposition.

48. The structure according to claim 26 where said superconductor layer is deposited by a process selected from the group consisting of evaporation, sputtering, chemical vapor deposition, spin coating and baking, pulsed laser deposition, cathodic arc deposition, plasma enhanced chemical vapor deposition, molecular beam epitaxy, a sol-gel process, liquid phase epitaxy, and combinations thereof.

49. The structure according to claim 26 wherein said insulating material is a ceramic oxide selected from the group consisting of magnesium oxide, iron oxide, molybdenum oxide, manganese oxide, zinc oxide, chromium oxide, silicon oxide, and combinations thereof.

50. The structure according to claim 26, wherein the substrate has a length of at least about 100m.

51. A method for producing a superconductor structure, comprising:
providing a buffered substrate comprising a substrate and at least one buffer layer;
depositing on the buffered substrate at least one insulating strip that continuously extends along the length of said buffered substrate and consists of insulating material with a resistivity greater than about 1 mΩcm, such that the at least one insulating strip has a first and second surface opposite each other and said first surface is adjacent to said buffered substrate; and
depositing a superconducting material on said the buffered substrate to form a superconducting layer comprised of at least two superconductor filaments that continuously extend along the length of said substrate, are separated from each other by the at least one insulating strip in a gap therebetween, and are substantially parallel,
wherein the second surface of said insulating strip is substantially free of said superconductor material.

52. The method of claim 51 wherein the high temperature superconductor is capable of operation with an AC loss less than 1 W/m measured at 77 K in an AC magnetic field of 100 mT and a frequency of 60 Hz applied perpendicular to a surface of said structure.

53. The method of claim 51 wherein the depositing superconducting material on said the buffered substrate to form a superconducting layer comprises positing a layer of $REBa_2Cu_3O_{7-x}$, wherein RE is a rare earth element.

54. The method of claim 53, wherein the superconducting layer is selected from the group comprising $YBa_2Cu_3O_{7-x}$, $Bi_2Sr_2Ca_2Cu3O_{10+y}$, $Ti_2Ba_2Ca_2Cu_3O_{10+y}$, $HgBa_2Ca_2Cu_3O_{8+y}$, and combinations thereof.

55. The method of claim 51 wherein said at least one insulating strip is deposited by a process selected from the group consisting of deposition through a mask, ink jet printing, screen printing, stamping, patterning, and combinations thereof.

56. The method of claim 55 wherein the process for deposition through a mask is selected from the group consisting of sputtering, chemical vapor deposition, sol gel coating, evaporation and laser ablative deposition.

57. The method of claim 51 wherein said superconductor layer is deposited by a process selected from the group consisting of evaporation, sputtering, chemical vapor deposition, spin coating and baking, pulsed laser deposition, cathodic arc deposition, plasma enhanced chemical vapor deposition, molecular beam epitaxy, a sol-gel process, liquid phase epitaxy, and combinations thereof.

58. A method for producing a high temperature superconductor structure, comprising:
providing a buffered substrate comprising a substrate and at least one buffer layer;

depositing superconducting material on said the buffered substrate to form a superconducting layer;

depositing on superconducting material on the buffered substrate at least one insulating strip that continuously extends along the length of said buffered substrate and is comprised of insulating material with a resistivity greater than about 1 mΩcm, wherein the at least one insulating strip has a first and second surface opposite each other and said first surface is adjacent to said superconducting and heat treating the at least one insulating strip on the superconducting material on the buffered substrate to provide a non superconducting material beneath the at least one insulating strip, wherein the formed at least two superconductor filaments are separated from each other by the at least one non superconducting region.

59. The method of claim 58 wherein the high temperature superconductor is capable of operation with an AC loss less than 1 W/m measured at 77 K in an AC magnetic field of 100 mT and a frequency of 60 Hz applied perpendicular to a surface of said structure.

60. The method of claim 58 wherein positing superconducting material on said the buffered substrate to form a superconducting layer comprises positing a layer of $REBa_2Cu_3O_{7-x}$, wherein RE is a rare earth element.

61. The method of claim 60, wherein the superconducting layer is selected from the group comprising $YBa_2Cu_3O_{7-x}$, $Bi_2Sr_2Ca_2Cu_3O_{10+y}$, $Ti_2Ba_2Ca_2Cu_3O_{10+y}$, $HgBa_2Ca_2Cu_3O_{8+y}$ and combinations thereof.

62. The method of claim 58 wherein said at least one insulating strip is deposited by a process selected from the group consisting of deposition through a mask, ink jet printing, screen printing, stamping, patterning, and combinations thereof.

63. The method of claim 52 wherein the process for deposition through a mask is selected from the group consisting of sputtering, chemical vapor deposition, sol gel coating, evaporation and laser ablative deposition.

64. The method of claim 58 wherein said superconductor layer is deposited by a process selected from the group consisting of evaporation, sputtering, chemical vapor deposition, spin coating and baking, pulsed laser deposition, cathodic arc deposition, plasma enhanced chemical vapor deposition, molecular beam epitaxy, a sol-gel process, liquid phase epitaxy, and combinations thereof.

* * * * *